United States Patent
Willkofer et al.

(10) Patent No.: US 8,674,800 B2
(45) Date of Patent: Mar. 18, 2014

(54) SEMICONDUCTOR DEVICE AND METHOD OF MANUFACTURE THEREOF

(71) Applicant: Infineon Technologies AG, Neubiberg (DE)

(72) Inventors: Stefan Willkofer, Munich (DE); Uwe Wahl, Munich (DE); Bernhard Knott, Neumarkt (DE); Markus Hammer, Pielenhofen (DE); Andreas Strasser, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/967,053

(22) Filed: Aug. 14, 2013

(65) Prior Publication Data

US 2013/0328166 A1   Dec. 12, 2013

Related U.S. Application Data

(62) Division of application No. 13/008,591, filed on Jan. 18, 2011.

(51) Int. Cl.
*H01F 5/00* (2006.01)
*H01F 27/28* (2006.01)

(52) U.S. Cl.
USPC .......................... 336/200; 336/232

(58) Field of Classification Search
USPC .................................. 336/200, 232
See application file for complete search history.

(56) References Cited

U.S. PATENT DOCUMENTS

| 5,756,936 A * | 5/1998 | Viebranz et al. ............. 174/73.1 |
| 5,776,553 A * | 7/1998 | Jaffe et al. ...................... 427/577 |
| 7,692,310 B2 | 4/2010 | Park et al. |
| 7,804,078 B2 | 9/2010 | Fiorito et al. |
| 2008/0061631 A1 | 3/2008 | Fouquet et al. |
| 2008/0179963 A1 | 7/2008 | Fouquet et al. |
| 2008/0180206 A1 | 7/2008 | Fouquet et al. |
| 2008/0311862 A1 * | 12/2008 | Spina et al. ....................... 455/78 |
| 2009/0052214 A1 | 2/2009 | Edo et al. |
| 2009/0243782 A1 | 10/2009 | Fouquet et al. |
| 2010/0259909 A1 * | 10/2010 | Ho et al. ........................ 361/767 |

OTHER PUBLICATIONS

Münzer, M., et al., "Coreless transformer a new technology for half bridge driver IC's," PCIM Conference, 2003, Nuremberg, 4 pages.
Frank, W., et al., "Coreless Transformer Provides Innovative Features: The expansion of the EiceDRIVER-family," Driver ICS, Bodo's Power Systems, www.bodospower.com, Jan. 2007, pp. 28, 30 and 31.

* cited by examiner

*Primary Examiner* — Tsz Chan
(74) *Attorney, Agent, or Firm* — Slater & Matsil, L.L.P.

(57) ABSTRACT

A semiconductor device, a method of manufacturing a semiconductor device and a method for transmitting a signal are disclosed. In accordance with an embodiment of the present invention, the semiconductor device comprises a first semiconductor chip comprising a first coil, a second semiconductor chip comprising a second coil inductively coupled to the first coil, and an isolating intermediate layer between the first semiconductor chip and the second semiconductor chip.

23 Claims, 4 Drawing Sheets

SEMICONDUCTOR DEVICE AND METHOD OF MANUFACTURE THEREOF

This is a divisional application of U.S. application Ser. No. 13/008,591, entitled "Semiconductor Device and Method of Manufacture Thereof" which was filed on Jan. 18, 2011 and is incorporated herein by reference.

TECHNICAL FIELD

The present invention relates generally to a semiconductor device and a method for manufacturing thereof and, in particular embodiments, to a transformer and a method for manufacturing thereof.

BACKGROUND

A transformer is a device that transfers electrical energy from one circuit to another through inductively coupled conductors. A varying current in the first or primary winding or first coil creates a varying magnetic field through the secondary winding or second coil. This varying magnetic field induces a varying electromotive force or "voltage" in the secondary winding.

If a load is connected to the secondary winding, an electric current will flow in the secondary winding and electrical energy will be transferred from the primary circuit through the transformer to the load. In an ideal transformer, the induced voltage in the secondary winding ($V_s$) is in proportion to the primary voltage ($V_p$), and is given by the ratio of the number of turns in the secondary winding ($N_s$) to the number of turns in the primary winding ($N_p$) as follows:

$$V_s/V_p = N_s/N_p$$

By appropriate selection of the ratio of turns, a transformer thus allows an alternating current (AC) voltage to be "stepped up" by making $N_s$ greater than $N_p$, or "stepped down" by making $N_s$ less than $N_p$.

A transformer may also provide a galvanic isolation because charge-carrying particles that do not move from the first coil to the second coil but energy and/or information can still be exchanged between the two sections by means of an induction, electromagnetic wave, optical, acoustic, or mechanical coupling. Galvanic isolation may be used in situations where two or more electric circuits must communicate, but their grounds may be at different potentials.

SUMMARY OF THE INVENTION

In accordance with an embodiment of the present invention, a semiconductor device is disclosed. The semiconductor device comprises a first semiconductor chip comprising a first coil, a second semiconductor chip comprising a second coil inductively coupled to the first coil, and an isolating intermediate layer between the first semiconductor chip and the second semiconductor chip.

In accordance with an embodiment of the present invention, a method for manufacturing a semiconductor device is disclosed. The method comprises manufacturing a first semiconductor chip comprising a first coil and manufacturing a second semiconductor chip comprising a second coil. The method further comprises aligning the first semiconductor chip with the second semiconductor chip so that the first coil is arranged opposite to the second coil and bonding the first semiconductor chip with the second semiconductor chip.

In accordance with an embodiment of the present invention, a method for transmitting a signal is disclosed. The method comprises receiving a signal at a first connection pad of a first semiconductor chip, transforming the signal from a first coil on the first semiconductor chip to a second coil on the second semiconductor chip, and sending the signal via a second connection pad of the second semiconductor chip. The first semiconductor chip and the second semiconductor chip together form a transformer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a transformer. The invention may also be applied, however, to other semiconductor devices using coils or windings.

Discrete transformers or optical couplers are typically used for transmitting a signal from an input to an output providing safe galvanic isolation. A disadvantage of discrete transformers may be that they are relatively large and expensive to make, and that optical couplers may degrade over time.

Another device for level shifting with a safe galvanic isolation is a coreless transformer. The coreless transformer may integrate two coils of a transformer into an integrated circuit. While a discrete transformer generally needs a core to direct the magnetic flux, the coils in an integrated circuit can be placed close enough to spare the core. For example, the two windings may be isolated by a 14 μm silicon oxide between the first winding and the second winding.

Figure 1:
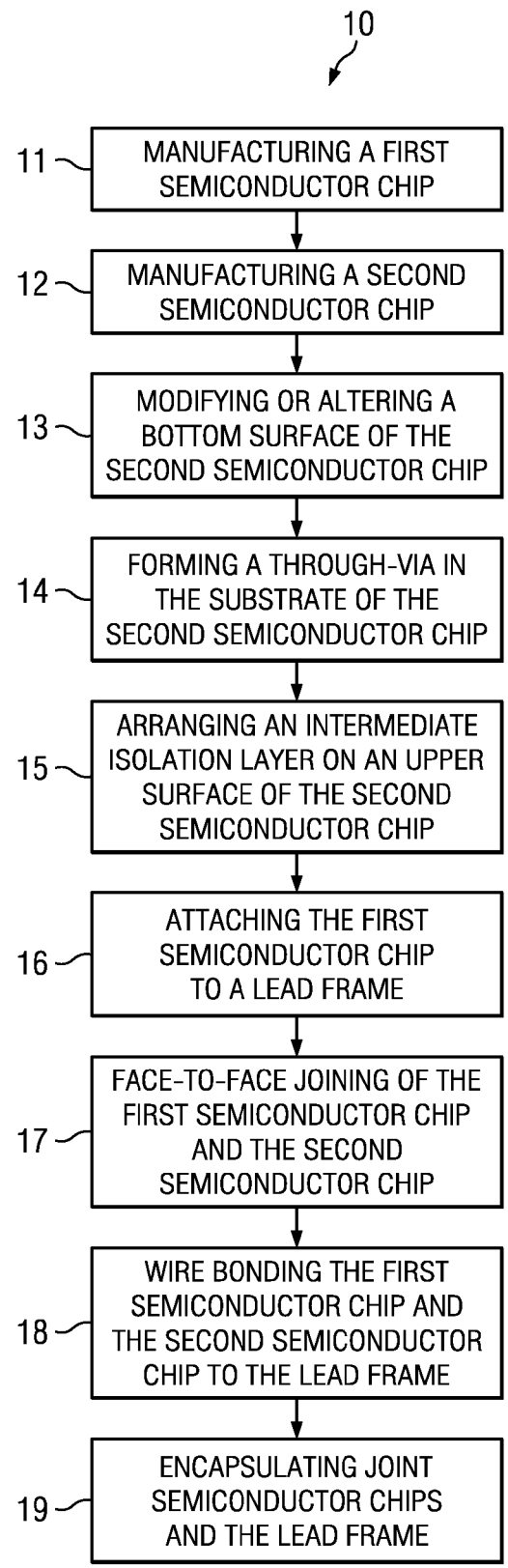
FIG. 1 shows a flow chart of an embodiment of a semiconductor device manufacturing process.

FIG. 1 shows a process flow 10 of a method of manufacturing a semiconductor device. Block 11 shows the manufacturing of a first semiconductor chip and block 12 shows the manufacturing of a second semiconductor chip. Block 13 shows modifying or altering of a bottom surface of the second semiconductor chip. Block 14 shows forming vias through the substrate of the second semiconductor chip. Block 15 shows arranging an intermediate isolation film on an upper surface of the second semiconductor chip. Block 16 shows attaching the first semiconductor chip to a lead frame. Block 17 shows a face-to-face joining of the first semiconductor chip and the second semiconductor chip. Block 18 shows wire bonding of the first semiconductor chip and the second semiconductor chip with the lead frame. And block 19 shows encapsulating of the joint semiconductor chips and the lead frame.

Figure 2:
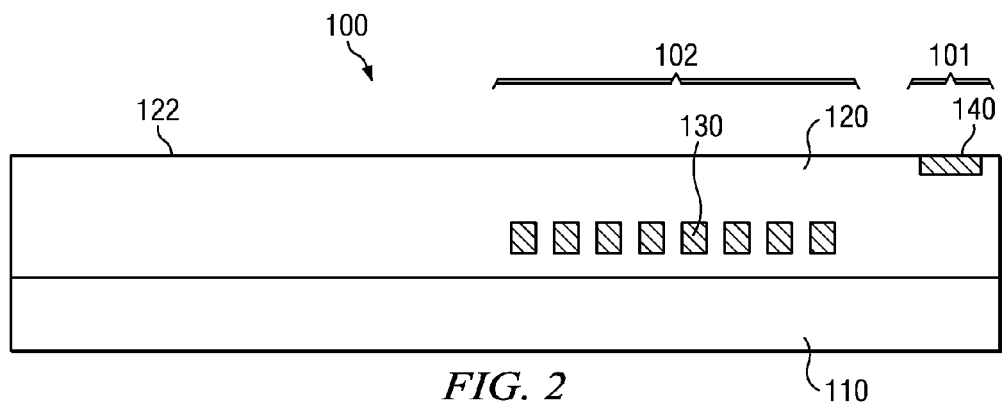
FIG. 2 illustrates an embodiment of a first semiconductor chip.

Each block of the process flow 10 will now be described in more detail in turn. The first semiconductor chip 100 of block 11 may be manufactured using a first manufacturing technology. The first manufacturing technology may be a CMOS, a BiCMOS, a bipolar CMOS DMOS (BCD) technology or the like. Referring now to FIG. 2, an embodiment of a first semiconductor chip 100 is shown. The first semiconductor chip 100 may be an integrated circuit comprising active and/or passive devices. The first semiconductor chip 100 may comprise a substrate 110 and a plurality of metallization layers 120. For example, a receiver integrated circuit may comprise 5-6 or more metallization layers in the current technology for leading edge products.

The first semiconductor chip 100 may comprise active devices and/or passive devices such as transistors, capacitors, diodes, and resistors arranged in the substrate 110. The substrate 110 may be silicon (Si), silicon-germanium (SiGe), gallium arsenide (GaAs), indium phosphide (InP), silicon carbide (SiC) or the like. The substrate 110 may be bulk silicon or silicon on insulator (SOI), for example. The passive and/or active devices arranged in the substrate 110 may be electrically connected through the metallization layers 120. A coil 130 and a contact pad 140 may be arranged in an upper layer or a top (last) layer of the metallization layers 120. The coil 130 may be arranged in a first region 101 and the contact pad 140 may be arranged in a second region 102. The first semiconductor chip 100 may be manufactured such that the top surface 122 of the semiconductor chip 100 is planar at least in the first region 101.

The second semiconductor chip 200 of block 12 may be manufactured using a second manufacturing technology. The second manufacturing technology can be a same manufacturing technology or a different manufacturing technology used to manufacture the first semiconductor chip 100. The second manufacturing technology may be a simpler manufacturing technology using fewer processing steps. For example, the second semiconductor chip 200 may comprise less metallization layers than the first semiconductor chip 100. Alternatively, the second semiconductor chip 200 may be smaller than the first semiconductor chip 100 since less active and/or passive devices may be arranged on this chip. In one embodiment the second semiconductor chip 200 may not comprise other circuits but only comprise a coil, a contact pad and an electrical connection between the coil and the contact pad. In one embodiment the second semiconductor chip 200 may comprise only a coil, electrical connections, passive devices and contact pads. The coil and the contact pad may be arranged in an upper layer or a top (last) layer of the metallization layers.

Figure 3:
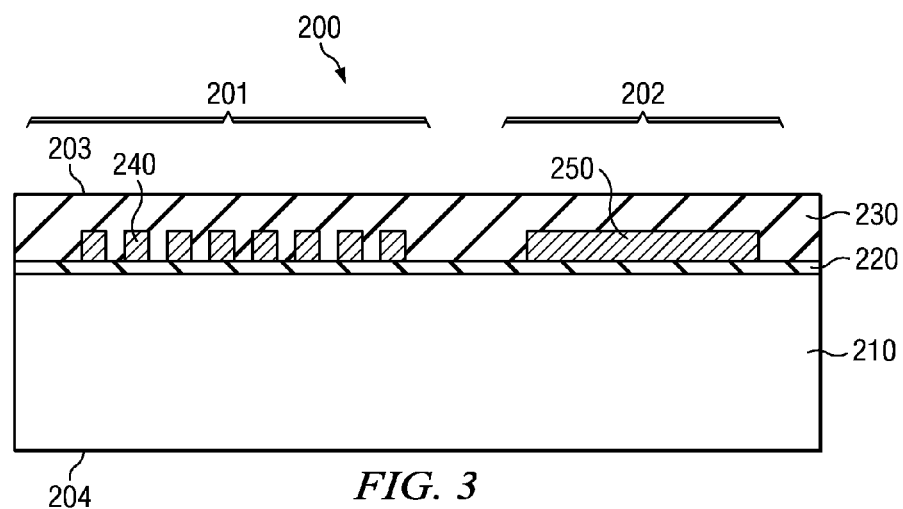
FIG. 3 shows an embodiment of a second semiconductor chip.

FIG. 3 shows an embodiment of the second semiconductor chip 200. FIG. 3 shows a substrate 210, a first isolation layer 220, a second isolation layer 230, a coil 240 and a contact pad 250. The coil 240 may be arranged in the first region 201 and the contact pad 250 may be arranged in the second region 202. In other embodiments the second semiconductor chip 200 may also comprise active devices and/or passive devices in the substrate 210. The active devices and/or passive devices may be electrically contacted via conductive lines in the isolation layer 230 or through one or more additional metallization layers (not shown). In one embodiment the isolation layer 220 may be only arranged in the second region 202 but not in the first region 201. A top surface of the second isolation region 230 in the second region 202 may be planar.

The second semiconductor chip 200 may be manufactured by forming a first isolation layer 220 over a substrate 210. The substrate 210 may be silicon (Si), silicon-germanium (SiGe), gallium arsenide (GaAs), indium phosphide (InP), silicon carbide (SiC) or the like. The substrate 210 may be bulk silicon or silicon on insulator (SOI), for example. The substrate 210 may comprise a thickness of about 400 µm to about 450 µm. The first isolation layer 220 may be a nitride layer or an oxide layer. The first isolation layer 220 may be formed as a thermal silicon oxide. The thermal oxide may comprise a thickness of about 100 nm and may be used as an etch stop layer.

In one embodiment a second isolation layer 230 may be formed over the first isolation layer 220. The second isolation layer 230 may be a silicon oxide, a silicon nitride or a combination thereof. A mask layer may be formed over the second isolation layer 230. The mask layer may be lithographically structured and patterned to form the coil 240 in the first region 201 and the contact pad 250 in the second region 202. The pattern may be transferred into the second isolation layer 230 so that openings are formed in the second isolation layer 230. The pattern may be transferred applying a dry etch process, for example. The openings may be filled with a conductive material such as copper or any other suitable material applying a plating process. The second semiconductor chip 200 may then be planarized to remove the conductive material over the second isolation layer 230. For example, a chemical mechanical polishing (CMP) step and/or an etch step may be applied removing the conductive material above the second isolation layer 230. The second isolation layer 230, the coil 240 and the contact pad 250 may be about 1 µm to about 6 µm or, alternatively, up to about 20 µm thick. A passivation layer may be formed over the openings and the second isolation layer 230 encapsulating the coil 240 and the contact pad 250 (shown as integrated into the second isolation layer 230). The thickness of the passivation layer may be about 0.5 µm to about 2 µm. In one embodiment an additional imide layer may deposited on the passivation layer (not shown). The imide layer may comprise a thickness of about 6 µm to about 12 µm.

In one embodiment the second semiconductor chip 200 may be manufactured using packaging technologies such as wafer level ball grid array (WLB) technology or embedded wafer level ball grid array (eWLB) technology. A mask layer may be formed over the first isolation layer 220. The mask layer may be lithographically structured, patterned and opened to form openings for the coil 240 and the contract pad 250. The openings may be filled with a conductive material such as copper or any other suitable material applying a plating process. The excess conductive material and the mask material may be removed. The coil 240 and the contact pad 250 may be embedded in a dielectric material 230. The dielectric material 230 may comprise durimid, polimid or a WPR™ from JSR Micro. The dielectric material 230 may be optionally planarized with a planarization process such as a chemical mechanical polishing (CMP) process. The thickness of the dielectric material 230 may comprise about 3 µm to about 20 µm.

In one embodiment the second semiconductor chip 200 may be manufactured by forming a conductive material layer over the first isolation layer 220. The conductive material layer may be conformally formed over the first isolation layer 220 applying a sputtering process. The conductive material layer may comprise AlCu or AlSiCu or any other suitable conductive material. A mask may be formed over the conductive material layer. The mask may be lithographically structured and patterned and the areas of the conductive material layer which do not form the coil 240 and the contact pad 250 may be removed. The coil 240 and the conductive pad 250 may comprise a thickness of about 0.2 μm to about 2 μm. The mask may then be removed and a second isolation layer 230 may be formed over the first isolation layer 220, the coil 240 and the contact pad 250 to encapsulate these structures. A planarization process, such as a CMP, may optionally be applied. In one embodiment the excess isolation material above the coil 240 and the contact pad 250 is removed. A passivation layer may be formed over the openings and the second isolation layer 230 encapsulating the coil 240 and the contact pad 250 (not shown). The thickness of the passivation layer may be about 0.5 μm to about 2 μm. In one embodiment an additional imide layer may deposited on the passivation layer (not shown). The imide layer may comprise a thickness of about 6 μm to about 12 μm.

The first semiconductor chip 100 may be manufactured on a first wafer and the second semiconductor chip 200 may be manufactured on a second wafer. In case the second semiconductor chip 200 is smaller than the first semiconductor chip 100 more chips maybe manufactured on the second wafer than on the first wafer. In case the second semiconductor chip 200 is manufactured with less manufacturing steps than the first semiconductor chip 100 the second semiconductor chip may be cheaper to manufacture.

Figure 4:
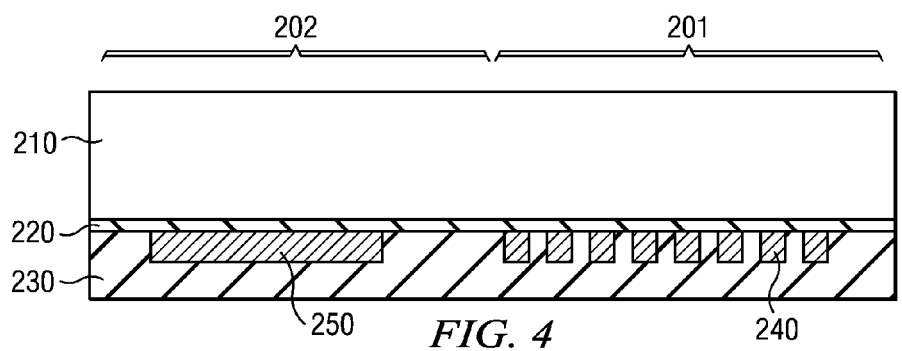
FIG. 4 shows a thinning of the second semiconductor chip.

Block 13 shows the bottom surface or back side 204 of the second semiconductor chip 200 modified or altered after the above manufacturing steps are completed. The substrate 210 of the second semiconductor chip 200 may be thinned to a thickness of less than about 300 μm. Alternatively, the substrate 210 may be thinned to thickness of about 300 μm to about 60 μm. In order to perform the thinning of the substrate 210, the wafer with the semiconductor chip 200 thereon is flipped. Thinning the substrate 210 to a predetermined thickness may comprise techniques such as grinding, etching or chemical-mechanical-polishing (CMP). A thinned second semiconductor chip 200 is shown in FIG. 4.

Figure 5:
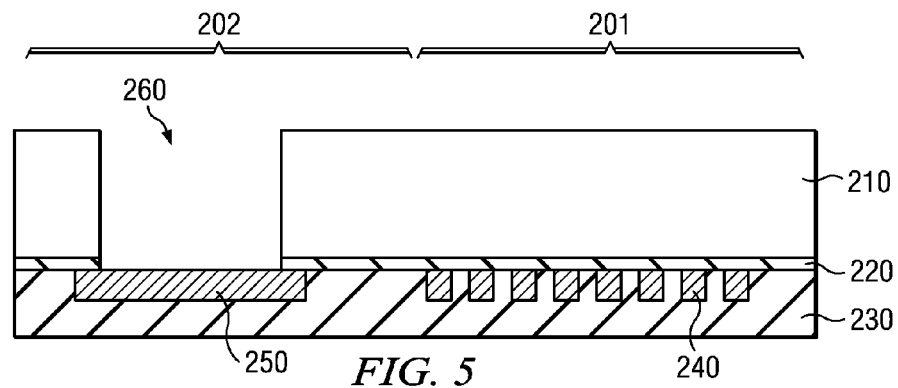
FIG. 5 shows forming a via in the second semiconductor chip.

Block 14 and FIG. 5 show forming vias 260 through the substrate 210 of the second semiconductor chip 200 after the substrate 210 is thinned. The via 260 may be formed in the second region 202 aligned with the conductive pad 250. The via 260 may be formed by forming a mask on the thinned substrate 210. The mask may be lithographically structured and patterned and the pattern is then transferred into the substrate 210. The via 260 may be a through-via extending from the bottom surface 204 of the semiconductor chip 200 to the first isolation layer 220. The via 260 may be formed by an etch process such as a Bosch™ etch process, for example. The Bosch™ etch process may comprise repeating the following steps: 1) isotropic etching such as a dry etching the silicon substrate 210 (wafer), 2) depositing a polymeric film over the substrate 210 (wafer) and the bottom surface and the sidewalls of the trench formed by the first etch step, and 3) opening the polymeric film over the substrate 210 (wafer) and the bottom surface of the trench but not along the sidewalls so that step 1) can again be applied. The first isolation layer 220 may be removed over the contact pad 250 by a second, different etch process. The second etch process may be a wet chemistry based on hydrogen fluoride (HF) or diluted HF etch.

Figure 6:
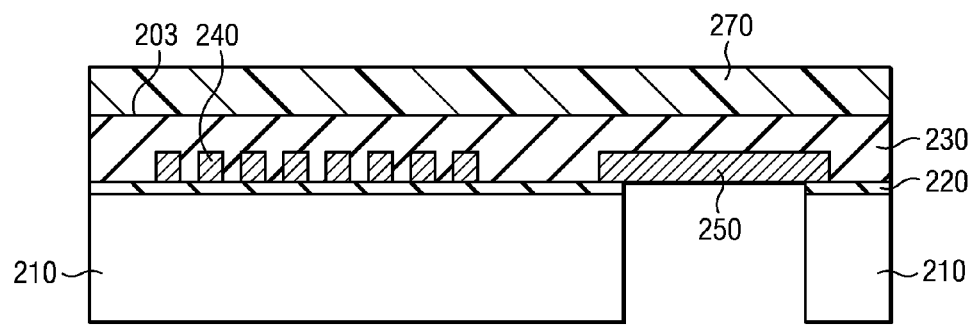
FIG. 6 illustrates disposing an intermediate isolation film on the second semiconductor chip.

In a next step the wafer is flipped again and an isolation film 270 is arranged on an upper side 203 of the second semiconductor chip 200. This is shown in block 15 and FIG. 6. The isolation film 270 maybe an adhesive film in one embodiment. The adhesive film may be adhesive on one side or on both sides of the film. The adhesive film material may be polyimid or Teflon (PTFE). In another embodiment the isolation film 270 may be non porous film. The isolation film 270 based on an adhesive film may comprise a dielectric strength of about 60 kV/mm to about 100 kV/mm. In one embodiment the adhesive film may comprise a thickness of about 20 μm to about 500 μm.

In one embodiment the isolation film 270 is formed by an attach paste. The attach paste may be based on a polyimid or a epoxide. The isolation film 270 may comprise a thickness of about 20 μm up to about 500 μm. The isolation film 270 based on an attach paste may comprise a dielectric strength of about 60 kV/mm to about 100 kV/mm. In one embodiment the adhesive film may comprise a thickness of about 20 μm to about 500 μm.

Up to now the process steps for manufacturing the second semiconductor chip 200 may generally be performed on a wafer level. In one embodiment the wafer is cut and the dice are singulated after the isolation film 270 is arranged on the wafer.

Figure 7:
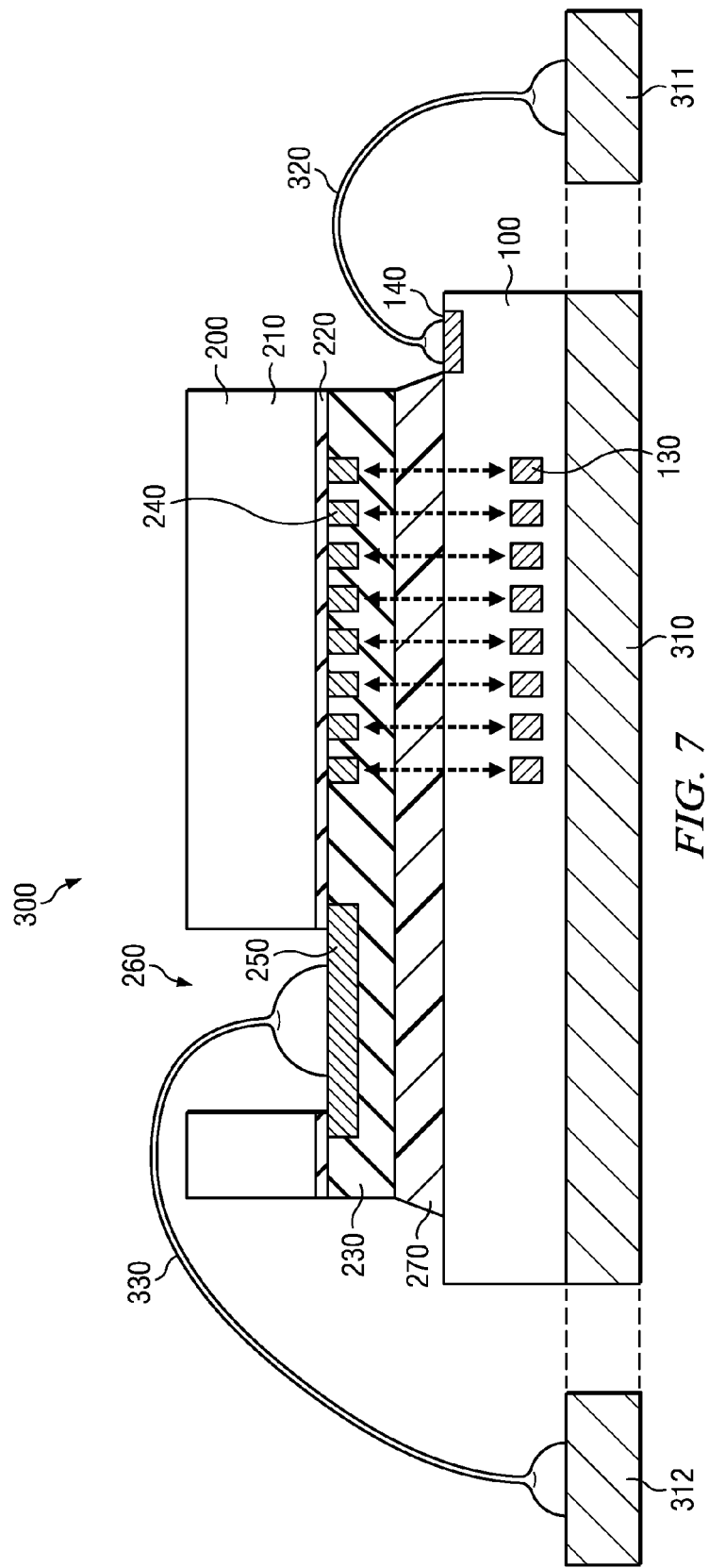
FIG. 7 shows an embodiment of a semiconductor device.

FIG. 7 shows a semiconductor device 300 assembled from a single first semiconductor chip 100 and a single second semiconductor chip 200. The semiconductor device comprises a lead frame 310, a first semiconductor chip 100, an isolation film 270 and a second semiconductor chip 200. The first semiconductor chip 100 is arranged over the lead frame 310. The second semiconductor chip 200 including the isolation film 270 is arranged face-to-face over the first semiconductor chip 100. In other words, an upper surface 122 of the first semiconductor chip 100 and an upper surface 203 of the second semiconductor chip 200 are arranged and aligned adjacent to each other but spaced apart by an isolation film 270. In one embodiment the coil 130 of the first semiconductor chip 100 and the coil 240 of the second semiconductor chip 200 are directly opposite each other and the top surfaces 122, 203 of the chips 100, 200 in regions 101 and 201 are planar.

Block 16 shows that the first semiconductor chip 100 may be attached to the leadframe 310 using a eutectic bonding or epoxy adhesive. Block 17 shows attaching the second semiconductor chip 200 to the first semiconductor chip 100. Attaching the second semiconductor chip 200 to the first semiconductor chip may be carried out by applying the second adhesive side of the intermediate isolation film 270 to the first semiconductor chip 100 or by attaching the first semiconductor chip 100 to the attach paste arranged on the second semiconductor chip 200. In one embodiment a reflow process may be applied to attach the first semiconductor chip 100 to the second semiconductor chip 200 via the attach paste.

Block 18 shows that the first semiconductor chip 100 and the second semiconductor chip 200 may then be wire bonded to the leadframe 310. For example, a wire 320 is first bonded to a chip pad 140 of the first semiconductor chip 100 and then bonded to a lead 311 of the lead frame 310. The wire 320 may comprise gold or copper. Alternatively, the wire 320 may comprise other metals or metal alloys.

In an alternative embodiment the wire 320 may be bonded to chip pad 140 of the first semiconductor chip 100 and the lead 311 of the lead frame 310 using a conductive adhesive. The wire 320 may be first attached to the chip pad 140 and then to the lead 311 of the leadframe 310.

The second semiconductor chip 200 may be bonded from the contact pad 250 to the lead 312 of the leadframe 310. The bonding of the contact pad 250 may take place through the via 260 of the second semiconductor device 200. In one embodiment the diameter of via 260 may be about 100 μm or more so that the bonder nozzle does not damage the substrate 210 of the second semiconductor chip 200. The wire 330 may be bonded to the lead frame 310 and the second semiconductor chip 200 using the same bonding techniques as described above for bonding the lead frame 310 to the first semiconductor chip 100.

In Block 19 the first and the second semiconductor chips 100, 200 and the lead frame 310 are now encapsulated to form a package. The package material may be a polymer or an epoxy.

In alternative embodiments the isolation film 270 may be arranged over the wafer comprising the first semiconductor chips 100 before these chips are singulated (similar to block 15). The second semiconductor chip 200 may be directly attached to the lead frame 310 (similar to block 16) and the first semiconductor chip 100 may be face-to-face joined with the second semiconductor chip 200 (similar to block 17). The semiconductor device 300 comprising of the lead frame 310, the second semiconductor chip 200 and the first semiconductor chip 100 may be wire bonded and encapsulated (similar to blocks 18 and 19). Embodiments may include variations and combinations of this embodiment with the embodiment disclosed in FIG. 1. For example, the isolation film 270 may be arranged on the second semiconductor device 200 and the second semiconductor device 200 may be directly bonded to the lead frame 310.

In one embodiment the package may include more than two semiconductor chips. For example, the first semiconductor chip may be a receiver IC, the second semiconductor chip may be a coil chip and a third semiconductor chip may be a transmitter chip. In this embodiment the coil chip may be connected directly to the transmitter and the transmitter and the receiver each in turn may be electrically connected to the lead frame of a transceiver package.

Figure 8:
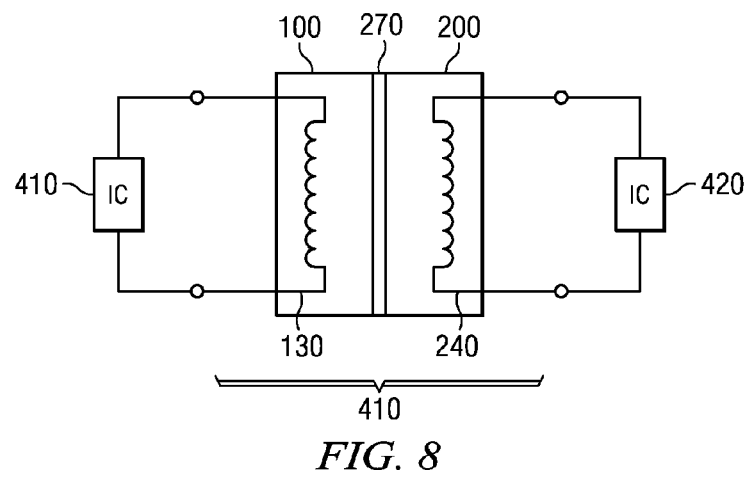
FIG. 8 shows a coreless transformer.

Referring now to FIG. 8, the two coils 130, 240 of the first semiconductor chip 100, the isolating film 270 and the second semiconductor chip 200 may form a coreless transformer 400. A first electrical circuit 410 may be electrically connected to the first semiconductor chip 100 and a second electrical circuit 420 may be electrically connected to the second semiconductor chip 200. A signal may be transmitted from the first electrical circuit 410 to the second electrical circuit 420 using embodiments of the semiconductor device 300. The transformer 400 may eutecticly isolate the two electrical circuits 410, 420. It is noted that the first semiconductor chip 100 and/or the second semiconductor chip 200 may comprise additional circuitry on the chip.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a first semiconductor chip comprising a first coil;
   an isolating film disposed on the first semiconductor, wherein the isolating film is a double sided adhesive film having a dielectric strength between 60 kV/mm and 100 kV/mm; and
   a second semiconductor chip comprising a second coil, the second semiconductor chip disposed on the isolating film and the second coil configured to be inductively coupled to the first coil.

2. The semiconductor device according to claim 1, wherein the isolating film comprises a thickness of 20 μm to 500 μm.

3. The semiconductor device according to claim 1, wherein the first semiconductor chip comprises an integrated circuit and wherein the second semiconductor chip consists essentially of a second pad, the second coil and an electrical connection between the second pad and the second coil.

4. The semiconductor device according to claim 1, wherein the semiconductor device further comprises a lead frame, wherein a first pad of the first semiconductor chip is wire bonded to the lead frame and where a second pad of the second semiconductor chip is wire bonded to the lead frame.

5. The semiconductor device according to claim 1, wherein the first coil of the first semiconductor chip and the second coil of the second semiconductor chip form a coreless transformer.

6. A semiconductor device comprising:
   a leadframe;
   a first semiconductor chip disposed on the leadframe and comprising a first coil;
   a second semiconductor chip comprising a second coil aligned with the first coil, the second semiconductor chip disposed on the first semiconductor chip;
   an isolating film between the first semiconductor chip and the second semiconductor chip, wherein the isolating film is an attach paste having a dielectric strength between 60 kV/mm and 100 kV/mm; and
   an encapsulation material encapsulating the first semiconductor chip, the second semiconductor chip and the leadframe.

7. The semiconductor device according to claim 6, wherein the first semiconductor chip comprises an integrated circuit and wherein the second semiconductor chip consists essentially of a pad, the second coil and an electrical connection between the pad and the second coil.

8. The semiconductor device according to claim 6, wherein the first semiconductor chip and the second semiconductor chip are arranged in a face-to-face configuration.

9. The semiconductor device according to claim 6, wherein the second semiconductor chip comprises a substrate and wherein the second semiconductor chip comprises a through-via through the substrate so that the through-via exposes a pad of the second semiconductor chip.

10. The semiconductor device according to claim 9, wherein the substrate comprises a thickness of less than 300 μm.

11. The semiconductor device according to claim 9, further comprising a first wire connection between the leadframe and the pad of the second semiconductor chip and a second wire connection between the leadframe and a pad of the first semiconductor chip.

12. The semiconductor device according to claim 11, wherein there is no wire connection between the first semiconductor chip and the second semiconductor chip.

13. The semiconductor device according to claim 11, wherein the pad of the first semiconductor chip is disposed on a top surface of the first semiconductor chip.

14. The semiconductor device according to claim 6, wherein a substrate of the first semiconductor chip is connected via a metal bond to the leadframe.

15. The semiconductor device according to claim 6, wherein a substrate of the first semiconductor chip is connected via an adhesive bond to the leadframe.

16. The semiconductor device according to claim 6, further comprising a third semiconductor chip, the third semiconductor chip encapsulated with the encapsulation material.

17. A semiconductor device comprising:
a leadframe;
a coreless transformer disposed on the leadframe, the coreless transformer comprising
　a first semiconductor chip with a first coil;
　a second semiconductor chip with a second coil; and
　an isolating film between the first semiconductor chip and the second semiconductor chip, wherein the isolating film is an attach paste having a dielectric strength between 60 kV/mm and 100 kV/mm; and
an encapsulation material encapsulating the coreless transformer and the leadframe.

18. The semiconductor device according to claim 17, wherein the first semiconductor chip comprises an integrated circuit and wherein the second semiconductor chip consists essentially of a pad, the second coil and an electrical connection between the pad and the second coil.

19. A semiconductor device comprising:
a first semiconductor chip comprising a first coil;
an isolating film disposed on the first semiconductor, wherein the isolating film is an attach paste having a dielectric strength between 60 kV/mm and 100 kV/mm; and
a second semiconductor chip comprising a second coil, the second semiconductor chip disposed on the isolating film and the second coil configured to be inductively coupled to the first coil.

20. A semiconductor device comprising:
a leadframe;
a first semiconductor chip disposed on the leadframe and comprising a first coil;
a second semiconductor chip comprising a second coil aligned with the first coil, the second semiconductor chip disposed on the first semiconductor chip;
an isolating film between the first semiconductor chip and the second semiconductor chip, wherein the isolating film is a double sided adhesive film having a dielectric strength between 60 kV/mm and 100 kV/mm; and
an encapsulation material encapsulating the first semiconductor chip, the second semiconductor chip and the leadframe.

21. The semiconductor device according to claim 20, wherein the first semiconductor chip and the second semiconductor chip are arranged in a face-to-face configuration and form a coreless transformer.

22. The semiconductor device according to claim 21, the second semiconductor chip comprises a substrate, wherein the second semiconductor chip comprises a through-via through the substrate so that the through-via exposes a first pad, wherein the first pad is connected via a first wire connection to the leadframe, wherein a second pad is disposed on the first semiconductor chip, and wherein the second pad is connected via a second wire connection to the leadframe.

23. A semiconductor device comprising:
a leadframe;
a coreless transformer disposed on the leadframe, the coreless transformer comprising
　a first semiconductor chip with a first coil;
　a second semiconductor chip with a second coil; and
　an isolating film between the first semiconductor chip and the second semiconductor chip, wherein the isolating film is a double sided adhesive film having a dielectric strength between 60 kV/mm and 100 kV/mm; and
an encapsulation material encapsulating the coreless transformer and the leadframe.

* * * * *